United States Patent
Kim et al.

(10) Patent No.: US 10,522,698 B2
(45) Date of Patent: Dec. 31, 2019

(54) METHOD FOR MANUFACTURING SOLAR CELL HAVING SELECTIVE EMITTER AND SOLAR CELL MANUFACTURED THEREBY

(71) Applicant: CHEIL INDUSTRIES INC., Gyeongsangbuk-do (KR)

(72) Inventors: Yong Hyun Kim, Uiwang-si (KR); JiYoun Lee, Uiwang-si (KR); Jung Chul Lee, Uiwang-si (KR)

(73) Assignee: SAMSUNG SDI CO., LTD., Yongin-si, Gyeonggi-do (KR)

(*) Notice: Subject to any disclaimer, the term of this patent is extended or adjusted under 35 U.S.C. 154(b) by 324 days.

(21) Appl. No.: 14/892,943

(22) PCT Filed: Sep. 24, 2013

(86) PCT No.: PCT/KR2013/008544
§ 371 (c)(1),
(2) Date: Nov. 20, 2015

(87) PCT Pub. No.: WO2014/189178
PCT Pub. Date: Nov. 27, 2014

(65) Prior Publication Data
US 2016/0126374 A1    May 5, 2016

(30) Foreign Application Priority Data

May 22, 2013  (KR) .................. 10-2013-0057999

(51) Int. Cl.
*H01L 31/068* (2012.01)
*H01L 31/18* (2006.01)
(Continued)

(52) U.S. Cl.
CPC .............. *H01L 31/022433* (2013.01); *H01L 31/02021* (2013.01); *H01L 31/068* (2013.01);
(Continued)

(58) Field of Classification Search
CPC ....... H01L 31/022433; H01L 31/02021; H01L 31/1804; H01L 31/068; H01L 31/1864
See application file for complete search history.

(56) References Cited

U.S. PATENT DOCUMENTS

2008/0213936 A1* 9/2008 Hatai ............... H01L 21/67282
                                                                438/60
2011/0014772 A1    1/2011  Chen
(Continued)

FOREIGN PATENT DOCUMENTS

CN          201414093 Y      2/2010
CN          101871439 A     10/2010
(Continued)

OTHER PUBLICATIONS

Office Action dated Nov. 30, 2016 in the corresponding Chinese Patent Application No. 201380076690.2.
(Continued)

*Primary Examiner* — Duy T Nguyen
(74) *Attorney, Agent, or Firm* — Lee & Morse, P.C.

(57) ABSTRACT

The present invention relates to a method for manufacturing a solar cell comprising a selective emitter, the method comprising the steps of: forming an electrode pattern and an alignment mark by performing a first impurity doping locally on one surface of a substrate; and performing a second impurity doping on the entire surface of the first doped substrate, wherein, as a result of the first and second doping, the alignment mark is formed on a first emitter or a second emitter, and the electrode pattern is formed on the second emitter. When manufacturing the selective emitter, the alignment mark is formed by doping processes. The use of the alignment mark may increase the matching of the electrode pattern formed in the selective emitter and the resulting electrode line. Further, a solar cell having the
(Continued)

selective emitter has excellent conversion efficiency and a high fill factor value.

14 Claims, 4 Drawing Sheets

(51) Int. Cl.
    *H01L 31/02* (2006.01)
    *H01L 31/0224* (2006.01)

(52) U.S. Cl.
    CPC ...... *H01L 31/1804* (2013.01); *H01L 31/1864* (2013.01); *Y02E 10/547* (2013.01); *Y02P 70/521* (2015.11)

(56) References Cited

U.S. PATENT DOCUMENTS

| | | | | |
|---|---|---|---|---|
| 2011/0056551 A1* | 3/2011 | Kim | ............... | H01L 31/02242 136/256 |
| 2011/0237022 A1* | 9/2011 | Bateman | ............... | H01L 21/266 438/96 |
| 2012/0100666 A1* | 4/2012 | Gee | ............... | H01L 21/67706 438/98 |
| 2013/0161573 A1* | 6/2013 | Torardi | ............... | H01L 31/02242 252/514 |
| 2013/0199606 A1* | 8/2013 | Sheng | ............... | H01L 31/02242 136/256 |
| 2013/0298975 A1* | 11/2013 | Yang | ............... | H01L 31/02242 136/255 |

FOREIGN PATENT DOCUMENTS

| | | |
|---|---|---|
| CN | 101907381 A | 12/2010 |
| CN | 102034891 A | 4/2011 |
| CN | 102563904 A | 7/2012 |
| CN | 202442514 U | 9/2012 |
| CN | 103050571 A | 4/2013 |
| JP | 2001-203379 A | 7/2001 |
| JP | 2011-023690 A | 2/2011 |
| KR | 10-2006-0066280 A | 6/2006 |
| KR | 10-2011-0027218 A | 3/2011 |
| KR | 10-2013-0012494 A | 2/2013 |

OTHER PUBLICATIONS

Office Action dated Aug. 21, 2017 in the corresponding Chinese Patent Application No. 201380076690.2.

* cited by examiner

METHOD FOR MANUFACTURING SOLAR CELL HAVING SELECTIVE EMITTER AND SOLAR CELL MANUFACTURED THEREBY

CROSS REFERENCE TO RELATED APPLICATIONS

This is the U.S. national phase application based on PCT Application No. PCT/KR2013/008544, filed Sep. 24, 2013, which is based on Korean Patent Application No. 10-2013-0057999, filed May 22, 2013, the entire contents of all of which are hereby incorporated by reference.

TECHNICAL FIELD

The present invention relates to a method for manufacturing a solar cell and a solar cell manufactured thereby, and more particularly, to a method for manufacturing a solar cell including a selective emitter and a solar cell manufactured thereby.

BACKGROUND ART

A solar cell includes a substrate and an emitter layer which are formed of different conductive type semiconductors, such as p-type and n-type semiconductors, respectively. Here, the emitter is placed on a light entering surface of the substrate, and a p-n junction is formed at an interface between the substrate and the emitter.

A front electrode is formed on an upper surface of the emitter to be electrically connected to the emitter, and a rear electrode is formed on the other surface of the substrate opposite the light entering surface to be electrically connected to the substrate.

When light enters such a solar cell, electrons within the semiconductor become free electrons (hereinafter, referred to as "electrons") through a photoelectric effect, and the electrons and holes move towards the n-type semiconductor and the p-type semiconductor, for example, the emitter and the substrate, respectively, according to the principle of a p-n junction. Then, the electrons and the holes move towards the respective electrodes electrically connected to the substrate and the emitter.

In this solar cell, solar cell efficiency is affected by concentration of a dopant with which the emitter is doped. By way of example, when the dopant with which the emitter is doped is in low concentration, i.e. when the emitter is formed as a lightly doped portion, recombination of electrons and holes is reduced, causing increase in short circuit current density (Jsc) and open circuit voltage (Voc), whereas contact resistance is increased, causing decrease in fill factor. On the contrary, when the dopant with which the emitter is doped is in high concentration, i.e. when the emitter is formed as a heavily doped portion, contact resistance is decreased, causing increase in fill factor, whereas short circuit current density (Jsc) and open circuit voltage (Voc) is decreased.

Thus, recently, there has been developed a solar cell which may take advantage of both the lightly and heavily doped portions, for example, a solar cell including a selective emitter.

A solar cell including a selective emitter has a structure wherein an emitter is composed of a first emitter portion (a lightly doped portion) and a second emitter portion (highly doped portion) and a front electrode is formed on the second emitter portion, and thus exhibits enhanced conversion efficiency as compared with a typical solar cell wherein a dopant is doped at a uniform concentration over the entire area of an emitter.

However, in a solar cell including a selective emitter, when a front electrode is not formed exactly on a selectively heavily doped second emitter portion, parallel resistance is increased, causing reduction in fill factor and thus deterioration in solar cell efficiency.

Therefore, there is a need for an aligned printing method which allows printed electrode patterns to be more accurately bonded to a second emitter portion in printing a composition for electrodes on a selective emitter.

DISCLOSURE

Technical Problem

It is one object of the present invention to provide a method for manufacturing a solar cell in which an alignment mark is formed by doping in fabrication of a selective emitter, and aligned printing of a composition for solar cell electrodes is performed using the alignment mark, thereby enhancing a degree of matching between electrode patterns formed on the selective emitter and prepared electrode lines.

It is another object of the present invention to provide a solar cell which is manufactured by the method as set forth above and thus exhibits excellent conversion efficiency and fill factor.

The above and other objects may be achieved according to the present invention described below.

Technical Solution

In accordance with one aspect of the present invention, a method for manufacturing a solar cell includes: performing primary doping in which a dopant is doped locally on one surface of a substrate to form an electrode pattern portion and an alignment mark; and performing secondary doping in which a dopant is doped over the primarily doped surface of the substrate, wherein, by primary and secondary doping, the alignment mark is formed as a first emitter portion or a second emitter portion, and the electrode pattern portion is formed as a second emitter portion.

Primary doping may include printing a doping paste on the substrate to implant a dopant into the substrate.

The method may further include annealing at about 250° C. to about 350° C. for about 1 minute to about 10 minutes after primary doping.

Secondary doping may include gas doping in a furnace at about 800° C. to about 850° C. to implant a dopant into the substrate.

The first emitter portion may have a lower dopant concentration than the second emitter portion.

The second emitter portion may be formed on the substrate to a greater thickness than the first emitter portion.

Primary doping may be performed such that the alignment mark is separated from the electrode pattern portion, and the electrode pattern portion and the alignment mark may be formed as the second emitter portion by secondary doping.

Primary doping may be performed on all regions of the electrode pattern portion excluding a region to be formed with the alignment mark, and, by secondary doping, the alignment mark may be formed as the first emitter portion formed locally within the electrode pattern portion and the electrode pattern portion may be formed as the second emitter portion.

The electrode pattern portion may include at least one type of electrode pattern. The number of alignment marks may be from 1 to 6.

The number of alignment marks may be 2, 4, or 6, and the alignment marks may be arranged symmetrically.

The alignment mark may have a regular or irregular shape and a diameter of about 0.2 mm to about 2 mm.

The electrode pattern portion may include a bus bar pattern and a finger bar pattern. The substrate may be a p-type or n-type substrate.

In the method, a group V element may be used as a dopant when the substrate is a p-type substrate, and a group III element may be used as a dopant when the substrate is an n-type substrate.

The method may further include: performing aligned printing of a composition for solar cell electrodes on the second emitter portion using the alignment mark; and baking the printed composition to form a front electrode.

In accordance with another aspect of the invention, a solar cell may be manufactured by the method as set forth above.

Advantageous Effects

The present invention provides a method for manufacturing a solar cell including a selective emitter which forms alignment marks by doping in fabrication of a selective emitter and may increase a degree of matching between electrode patterns formed on a selective emitter and pre-pared electrode lines using the alignment marks. Thus, a solar cell manufactured by the method exhibits excellent conversion efficiency and fill factor.

BEST MODE

Figure 1A:
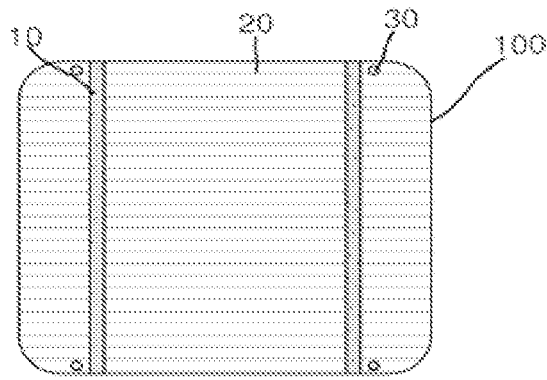
FIGS. 1(a) to 1(c) are schematic views of a method for manufacturing a solar cell including a selective emitter according to a first embodiment of the present invention.

Hereinafter, embodiments of the present invention will be described in detail.

Method for Manufacturing Solar Cell Including Selective Emitter

The present invention relates to a method for manufacturing a solar cell including a selective emitter, which includes: performing primary doping in which one surface of a substrate is locally doped with a dopant to form an electrode pattern portion and an alignment mark; and performing secondary doping in which a dopant is doped over the primarily doped surface of the substrate, wherein, by primary and secondary doping, the alignment mark is formed as a first or second emitter portion, and the electrode pattern portion is formed as a second emitter portion.

As such, when the alignment mark is formed by doping, it is possible to increase a degree of matching between electrode patterns formed on a selective emitter and electrode lines, thereby improving solar cell efficiency while maximizing process efficiency.

In step S1, primary doping in which a dopant is locally doped on one surface of the substrate is performed to form the electrode pattern portion and the alignment mark. The substrate may be a p-type or n-type substrate. Primary doping may include printing a doping paste on the substrate to implant a dopant into the substrate. The doping paste used for primary doping may include a group V element such as antimony (Sb), arsenic (As), phosphorus (P), and the like when the substrate is a p-type substrate, and may include a group III element such as boron (B), gallium (Ga), indium (In), and the like when the substrate is a n-type substrate.

As used herein, the second emitter portion may be defined as a heavily doped portion locally formed on the first emitter portion. The alignment mark formed by primary doping in step S1 may be formed as the first emitter portion or the second emitter portion after secondary doping in step S2 according to a formation method of the alignment mark, and the electrode pattern portion may be formed as the second emitter portion after secondary doping in step S2.

Step S1 may further include annealing at about 250° C. to about 350° C. for about 1 to about 10 minutes after primary doping. Annealing allows a dopant forming the electrode pattern portion or the alignment mark to be doped on the substrate while drying the printed doping paste.

In step S2, secondary doping in which a dopant is doped over the surface of the substrate having been subjected to primary doping in step S1 is performed. Secondary doping is a process in which a dopant is doped at a uniform concentration all over the surface of the substrate to provide a p-n junction, and may include gas doping wherein a dopant gas is introduced into a high temperature diffusion furnace in which the substrate to be doped is placed. Preferably, secondary doping is achieved by introducing a liquid-phase or vapor-phase gas into the furnace at about 800° C. to about 850° C.

Although the dopant gas may include a group V element such as antimony (Sb), arsenic (As), phosphorus (P), and the like when the substrate is a p-type substrate and may include a group III element such as boron (B), gallium (Ga), indium (In), and the like when the substrate is a n-type substrate, it is advantageous for manufacturing the selective emitter that the dopant gas include an element in the same group as that to which a dopant in the doping paste used for primary doping belongs, or the same element as the dopant. In step S2, introduction of the dopant gas may be performed in a furnace at about 800° C. to about 850° C. By secondary doping, the electrode pattern portion may be formed as the second emitter portion, and all regions of the substrate excluding the electrode pattern portion or the alignment mark may be formed as the first emitter portion.

In a first embodiment, primary doping may be achieved by printing the doping paste in a pattern wherein the alignment mark is separated from the electrode pattern portion. When the alignment mark is thus formed to be separated from the electrode pattern portion, each of the electrode pattern portion and the alignment mark may be formed as the second emitter portion in secondary doping, whereby the alignment mark may be visually recognized as distinct from the electrode pattern portion. Then, aligned printing is performed, i.e. a composition for solar cell electrodes is printed on the electrode pattern portion separated from the alignment mark and formed as the second emitter portion to be aligned with the electrode pattern portion using the alignment mark formed as the second emitter portion, followed by baking the printed composition, thereby forming an electrode on the electrode pattern portion.

In a second embodiment, primary doping may be achieved by printing the doping paste in a pattern wherein a region to be formed with the alignment mark within the electrode pattern portion is excluded from printing. The alignment mark is a region locally formed within the electrode pattern portion, and after secondary doping, the alignment mark may be formed as the first emitter portion and the electrode pattern portion may be formed as the second emitter portion. Then, aligned printing is performed, i.e. a composition for solar cell electrodes is printed on the electrode pattern portion formed as the second emitter portion to be aligned with the electrode pattern portion using the alignment mark formed as the first emitter portion, followed by baking the printed composition, thereby forming an electrode on the electrode pattern portion.

Secondary doping may be performed to a thickness of about 0.5 μm to about 2 μm, and the second emitter portion may have a surface resistance of about 50Ω/sq to about 80Ω/sq. The electrode pattern portion or the alignment mark to be formed as the second emitter portion may be distinguished from a lightly doped portion, which is the first emitter portion, through difference in dopant concentration between the first emitter portion and the second emitter portion, and thus may secure visibility as a mark for aligned printing. Thus, it is desirable in terms of visibility and solar cell efficiency that primary and secondary doping be performed such that the difference in surface resistance between the first emitter portion and the second emitter portion ranges from about 30Ω/sq to about 50Ω/sq.

The electrode pattern portion may include at least one type of electrode pattern. For example, the electrode pattern portion may include a bus bar pattern and a finger bar pattern.

The alignment mark may have a regular or irregular shape and a diameter of about 0.1 mm to about 2 mm, without being limited thereto. For example, the alignment mark may have a spherical shape, a tetragonal shape, a cross shape, a negative shape, and the like.

The number of alignment marks may be from 1 to 6. When the number of alignment marks is 2, 4, or 6, the alignment marks may be arranged symmetrically. When the alignment marks are arranged symmetrically, it is possible to further increase the degree of matching.

After preparing the selective emitter through steps S1 and S2, the method may further include: performing aligned printing in which a composition for solar cell electrodes is printed on the electrode pattern portion to be aligned therewith using the alignment mark formed on the selective emitter (S3); and baking the printed composition to form a front electrode (S4), thereby manufacturing a solar cell.

Aligned printing in step S4 may be performed, for example, using a Baccini printer, which may optically distinguish the alignment mark and perform precise printing based on the distinguished information.

FIG. 1 is a schematic view of a method for manufacturing a solar cell including a selective emitter according to the first embodiment of the present invention.

Figure 1B:
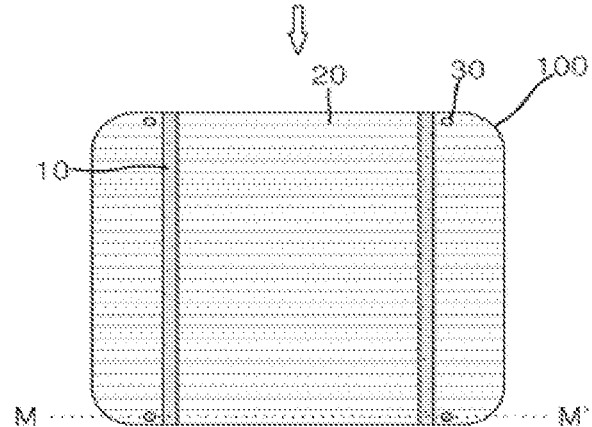

FIG. 1(a) shows electrode pattern portions 10, 20 and alignment marks 30 formed on one surface of a substrate 100 by primary doping, and FIG. 1(b) shows a selective emitter with alignment marks formed by secondary doping wherein a dopant is uniformly doped over the surface of the substrate having been subjected to primary doping. In the first embodiment, like the electrode pattern portions, the alignment marks are formed as the second emitter portion, which is a heavily doped portion. The electrode pattern portions may include bus bar patterns 10 and finger bar patterns 20, and the alignment marks 30 may be spaced from the electrode patterns.

Figure 1C:
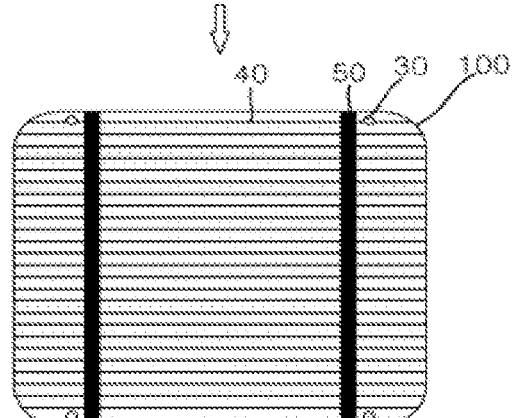

FIG. 1(c) shows electrode lines including finger bars 40 and bus bars 50 formed on the electrode pattern portions by aligned printing of a composition for solar cell electrodes using the alignment marks 30 formed according to the first embodiment.

Figure 3:
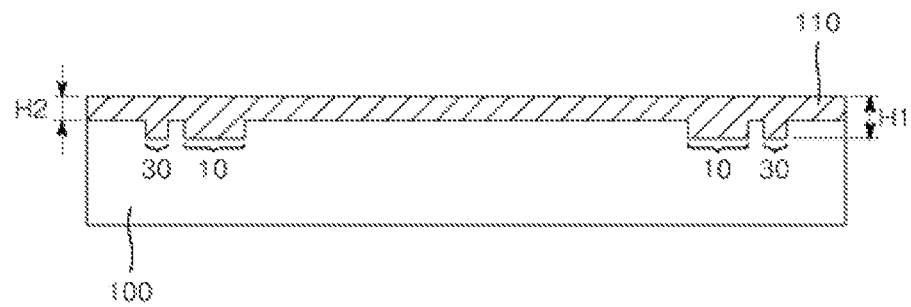
FIG. 3 is a sectional view of the selective emitter prepared according to the first embodiment taken along line M-M' in FIG. 1(b).

FIG. 3 is a sectional view of the selective emitter prepared according to the first embodiment taken along a line M-M' in FIG. 1(b). Referring to FIG. 3, it may be seen that an emitter layer 110 is composed of the first emitter portion and the second emitter portion; the bus bar patterns 10 and the alignment marks 30 are formed as the heavily doped second emitter portion; and the second emitter portion has a thickness H2 greater than the thickness H1 of the first emitter portion having not been subjected to secondary doping.

Figure 5A:
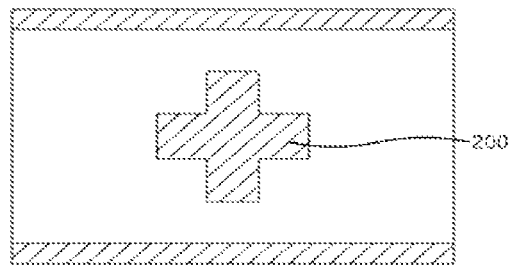
FIGS. 5(a) and 5(b) each illustrate an alignment mark formed on a substrate according to the first embodiment.
Figure 5B:
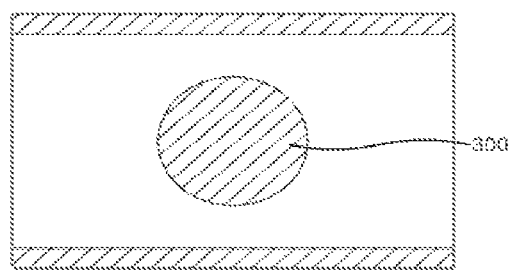

FIG. 5 shows alignment marks formed on a substrate according to the first embodiment. FIG. 5(a) shows a cross-shaped alignment mark 200 and FIG. 5(b) shows a spherical alignment mark 300.

FIG. 2 is a schematic view of a method for manufacturing a solar cell including a selective emitter according to the second embodiment of the present invention. The alignment marks according to the first embodiment are spaced from the electrode pattern portions, whereas, in the second embodiment, since primary doping is performed on all regions of electrode pattern portions excluding regions to be formed with alignment marks, the alignment marks remain as the first emitter portion, which is a lightly doped portion, after secondary doping, and regions of the electrode pattern portions surrounding the alignment marks are formed as the second emitter portion, which is a heavily doped portion. Thus, the alignment marks may be identified or visually recognized through difference in dopant concentration between the alignment marks and the electrode pattern portions. Accordingly, the alignment marks according to the second embodiment may be defined as a lightly doped portion locally formed within the electrode pattern portions.

Figure 2A:
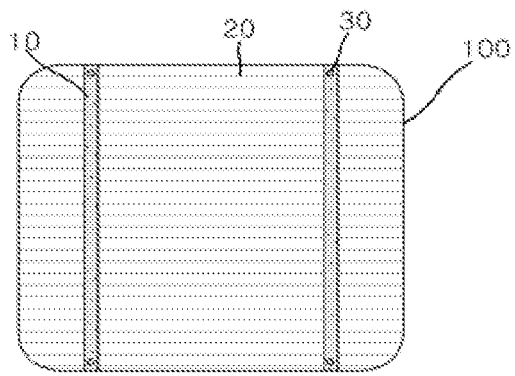
FIGS. 2(a) to 2(c) are schematic views of a method for manufacturing a solar cell including a selective emitter according to a second embodiment of the present invention.

Specifically, FIG. 2(a) shows a process wherein electrode pattern portions including bus bar patterns 10 and finger bar patterns 20 are formed by performing primary doping on one surface of a substrate 100, and alignment marks are formed as undoped regions within the electrode pattern portions. Here, the alignment marks are formed as undoped regions since primary doping is performed on all regions of the electrode patterns excluding regions to be formed with the alignment marks 30.

Figure 2B:
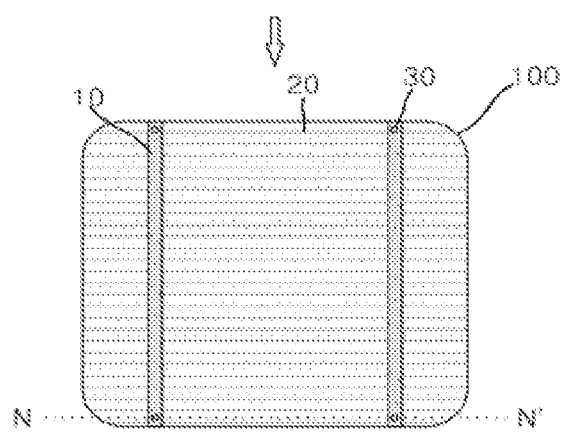

FIG. 2(b) shows a selective emitter wherein the alignment marks and the electrode pattern portions are formed as the first and second emitter portions, respectively, by secondary doping in which a dopant is uniformly doped over the surface of the substrate having been subjected to primary doping.

Figure 2C:
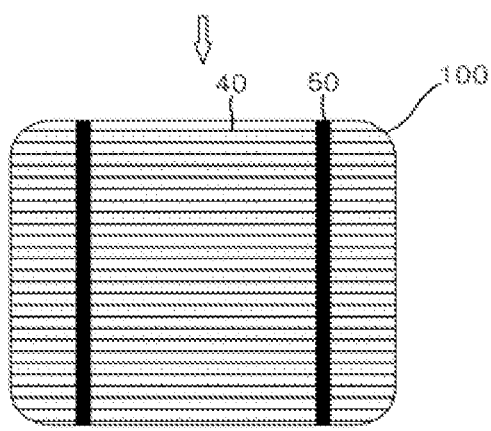

FIG. 2(c) shows electrode lines including finger bars 40 and bus bars 50 formed on the electrode pattern portions by aligned printing of a composition for solar cell electrodes using the alignment marks 30 formed according to the second embodiment.

Figure 4:
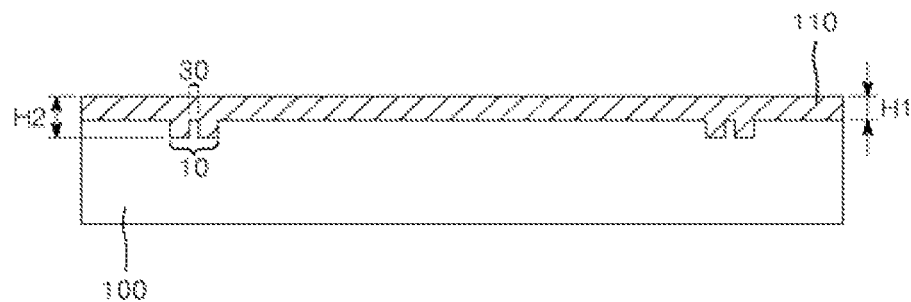
FIG. 4 is a sectional view of the selective emitter prepared according to the second embodiment taken along line N-N' in FIG. 2(b).

FIG. 4 is a sectional view of the selective emitter prepared according to the second embodiment taken along a line N-N' in FIG. 2(b). Referring to FIG. 4, an emitter layer 110 is composed of the first emitter portion and the second emitter portion; the bus bar patterns 10 are formed as the heavily doped second emitter portion by secondary doping; and the alignment marks 30 are formed as the first emitter portion by secondary doping since the alignment marks are excluded from printing in primary doping. Thus, the alignment marks formed within the electrode pattern portions may be identified through a difference in dopant concentration or a difference in doping thickness (H2−H1) between the bus bar patterns and the alignment marks.

Figure 5C:
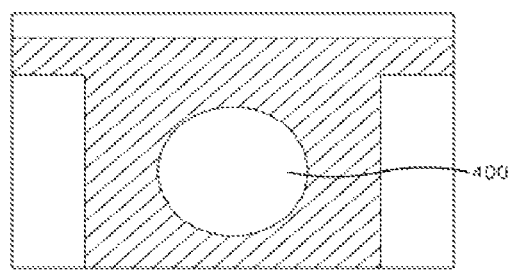
FIG. 5(c) illustrates an alignment mark formed on a substrate according to the second embodiment.

FIG. 5(c) shows an alignment mark formed as a lightly doped portion within an electrode pattern portion by secondary doping according to the second embodiment. Specifically, the alignment mark is a spherical alignment mark 400 formed within a bus bar.

Figure 6:
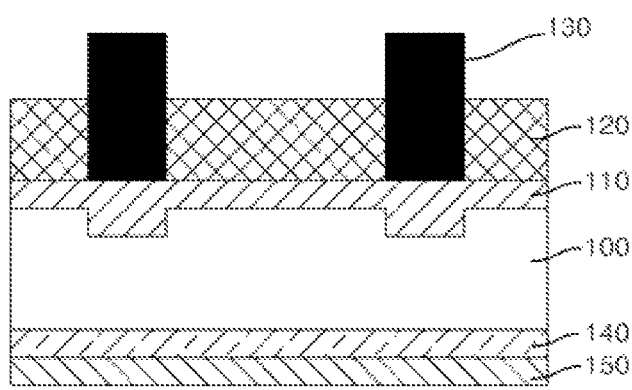
FIG. 6 is a sectional view of a solar cell including a selective emitter manufactured according to one embodiment of the present invention.

FIG. 6 is a sectional view of a solar cell manufactured according to one embodiment of the present invention. According to this embodiment, first, a selective emitter layer 110 including the first and second emitter portions is formed on an upper surface of a substrate 100 by doping, and then an anti-reflection film 120 is formed on an upper surface of the selective emitter layer, followed by aligned printing in which a composition for solar cell electrodes is printed on the second emitter portion, which is a heavily doped portion, to be accurately aligned therewith using alignment marks (not shown), and baking the printed composition, thereby forming a front electrode 130. The substrate 100 may be formed on a back surface thereof with a rear electrode 150. In addition, the substrate may further be formed with a back surface field (BSF) layer 140 on the back surface thereof.

MODE FOR INVENTION

Next, the present invention will be described in more detail with reference to examples. However, it should be noted that these examples are provided for illustration only and should not be construed in any way as limiting the invention.

EXAMPLES

Example 1

A doping paste (Honeywell Co., Ltd) including P, a group V element, was primarily doped on one surface of a p-type semiconductor substrate to a thickness of 5 μm using a 380 mesh screen, thereby printing electrode pattern portions and alignment marks spaced therefrom. The printed substrate was dried by heat treatment at 300° C. for 5 minutes. The dried substrate was placed in a diffusion furnace at 850° C., followed by introducing POCl$_3$ gas thereto, thereby performing secondary doping over the primarily doped surface of the substrate. As a result of secondary doping, the electrode pattern portions and the alignment marks were formed as a second emitter portion, and all regions of the substrate excluding the electrode pattern portions and the alignment marks were formed as a first emitter portion, whereby a selective emitter was prepared.

Thereafter, phosphosilicate glass (PSG) was removed from the secondarily doped surface of the substrate using HF, followed by coating SiN onto the surface of the substrate through PECVD, thereby forming an anti-reflection film.

Then, an aluminum paste was printed on a back surface of the substrate, followed by drying at 300° C., thereby forming a rear electrode.

Thereafter, a composition for solar cell electrodes (Paste SF8521, Cheil Industries) was printed on the electrode pattern portions to be aligned therewith using the alignment mark formed on the substrate using a Baccini printer, followed by baking in a BTU furnace at 960° C. to 980° C. for 40 seconds, thereby manufacturing a solar cell. The manufactured solar cell was evaluated as to short circuit current (Isc (A)), open circuit voltage (Voc (mV)), serial resistance (Rs (Ω)), sheet resistance (Rsh (Ω)), fill factor (%), and conversion efficiency (%) using a solar cell efficiency tester CT-801 (Pasan Co., Ltd.). Results are shown in Table 1.

Comparative Example 1

A solar cell including a selective emitter was manufactured in the same manner as in Example 1 except that an electrode was printed using a wafer edge rather than forming alignment marks, and then evaluated as to the above properties. Results are shown in Table 1.

TABLE 1

|  | Isc (A) | Voc (mV) | Rs (ohm) | Rsh (ohm) | FF (%) | Eff (%) |
| --- | --- | --- | --- | --- | --- | --- |
| Example 1 | 5.83 | 627 | 0.0049 | 22.75 | 78.44 | 18.56 |
| Comparative Example 1 | 5.82 | 622 | 0.0078 | 20.02 | 77.11 | 18.07 |

As shown in Table 1, it could be seen that the solar cell of Example 1 wherein aligned printing was performed using the alignment marks according to the present invention exhibited relatively good degree of matching between the heavily doped portion of the selective emitter and the printed electrode lines, as compared with the solar cell of Comparative Example 1 wherein the electrode was printed using a wafer edge, rather than forming alignment marks, and thus had excellent fill factor and conversion efficiency.

It should be understood that various modifications, changes, alterations, and equivalent embodiments may be made by those skilled in the art without departing from the spirit and scope of the invention.

The invention claimed is:
1. A method for manufacturing a solar cell, the method comprising:
performing primary doping in which a primary dopant is doped locally on one surface of a substrate to form an electrode pattern portion and at least one alignment mark;
performing secondary doping in which a secondary dopant is doped over the primarily doped surface of the substrate such that the electrode pattern portion and the at least one alignment mark are heavily-doped regions that are doped with the primary dopant together with the secondary dopant;
performing aligned printing of a composition for solar cell electrodes on the electrode pattern portion using the at least one alignment mark; and
baking the printed composition to form a front electrode, wherein:
the at least one alignment mark is formed as a second emitter portion by the primary doping and the secondary doping, and the electrode pattern portion is formed as the second emitter portion by the primary doping and the secondary doping.

2. The method according to claim 1, wherein the primary doping includes printing a doping paste on the substrate to implant the primary dopant from the doping paste into the substrate.

3. The method according to claim 2, further comprising:
annealing at about 250° C. to about 350° C. for about 1 minute to about 10 minutes after the primary doping.

4. The method according to claim 1, wherein the secondary doping includes gas doping in a furnace at about 800° C. to about 850° C. to implant the secondary dopant into the substrate.

5. The method according to claim 1, wherein the primary doping is performed such that the alignment mark is separated from the electrode pattern portion, and the electrode pattern portion and the alignment mark are formed as the second emitter portion by the primary doping and the secondary doping.

6. The method according to claim 1, wherein the primary doping includes forming 1 to 6 alignment marks.

7. The method according to claim 6, wherein:
the primary doping includes forming 2, 4, or 6 alignment marks, and
the alignment marks are arranged symmetrically.

8. The method according to claim 1, wherein the at least one alignment mark has a regular or irregular shape and a diameter of about 0.2 mm to about 2 mm.

9. The method according to claim 1, wherein the substrate is a p-type or n-type substrate.

10. The method according to claim 9, wherein:
the primary dopant and the secondary dopant each independently include a group V element when the substrate is a p-type substrate, and
the primary dopant and the secondary dopant each independently include a group III element when the substrate is an n-type substrate.

11. A solar cell manufactured by the method according to claim 1.

12. A method for manufacturing a solar cell, the method comprising:
performing primary doping in which a primary dopant is doped locally on one surface of a substrate to form an electrode pattern portion and 1 to 6 alignment marks; and
performing secondary doping in which a secondary dopant is doped over the primarily doped surface of the substrate such that the electrode pattern portion and the 1 to 6 alignment marks are heavily-doped regions that are doped with the primary dopant together with the secondary dopant,
wherein:
the 1 to 6 alignment marks are formed as a second emitter portion by the primary doping and the secondary doping, and
the electrode pattern portion is formed as the second emitter portion by the primary doping and the secondary doping.

13. The method according to claim 12, wherein:
the primary doping includes forming 2, 4, or 6 alignment marks, and
the alignment marks are arranged symmetrically.

14. A solar cell manufactured by the method of claim 12.

* * * * *